United States Patent
Takata

(10) Patent No.: US 11,171,630 B2
(45) Date of Patent: Nov. 9, 2021

(54) LADDER FILTER, DUPLEXER, AND ELASTIC WAVE FILTER DEVICE

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/385,035

(22) Filed: Apr. 16, 2019

(65) Prior Publication Data

US 2019/0245514 A1 Aug. 8, 2019

Related U.S. Application Data

(63) Continuation of application No. PCT/JP2017/037018, filed on Oct. 12, 2017.

(30) Foreign Application Priority Data

Oct. 28, 2016 (JP) .............................. JP2016-211975

(51) Int. Cl.
*H03H 9/64* (2006.01)
*H03H 9/72* (2006.01)
(Continued)

(52) U.S. Cl.
CPC .......... *H03H 9/568* (2013.01); *H03H 7/0161* (2013.01); *H03H 9/02858* (2013.01);
(Continued)

(58) Field of Classification Search
CPC ......... H03H 9/64; H03H 9/6483; H03H 9/725
(Continued)

(56) References Cited

U.S. PATENT DOCUMENTS 5,831,493 A    11/1998   Ushiroku
6,466,108 B2 * 10/2002   Matsuda ............ H03H 9/14552
                                                                                 310/313 B
(Continued)

FOREIGN PATENT DOCUMENTS

JP      08-65089 A     3/1996
JP      09-55640 A     2/1997
(Continued)

OTHER PUBLICATIONS

Official Communication issued in International Patent Application No. PCT/JP2017/037018, dated Dec. 12, 2017.

*Primary Examiner* — Dean O Takaoka
(74) *Attorney, Agent, or Firm* — Keating & Bennett, LLP

(57) ABSTRACT

A ladder filter includes series-arm resonators each including an IDT electrode and a reflector, and a parallel-arm resonator. In at least one of the series-arm resonators, where a wavelength that is determined by an electrode finger pitch of the IDT electrode is λ, an electrode finger center-to-center distance between an electrode finger located closest to the reflector among electrode fingers of the IDT electrode and an electrode finger located closest to the IDT electrode among electrode fingers of the reflector is less than about 0.5λ, and an anti-resonant frequency of the at least one of the series-arm resonators is higher than an anti-resonant frequency of at least another one of the series-arm resonators.

16 Claims, 7 Drawing Sheets

(51) Int. Cl.
*H03H 9/56* (2006.01)
*H03H 7/01* (2006.01)
*H03H 9/205* (2006.01)
*H03H 9/70* (2006.01)
*H03H 9/25* (2006.01)
*H03H 9/02* (2006.01)
*H03H 9/145* (2006.01)

(52) U.S. Cl.
CPC ........ *H03H 9/02881* (2013.01); *H03H 9/145* (2013.01); *H03H 9/1457* (2013.01); *H03H 9/205* (2013.01); *H03H 9/25* (2013.01); *H03H 9/64* (2013.01); *H03H 9/6469* (2013.01); *H03H 9/6483* (2013.01); *H03H 9/706* (2013.01); *H03H 9/72* (2013.01); *H03H 9/725* (2013.01)

(58) Field of Classification Search
USPC .......................................................... 333/133
See application file for complete search history.

(56) References Cited

U.S. PATENT DOCUMENTS

| | | | |
|---|---|---|---|
| 2005/0025324 A1* | 2/2005 | Takata | H03H 9/6483 381/190 |
| 2005/0077982 A1* | 4/2005 | Funasaka | H03H 9/02574 333/195 |
| 2014/0049340 A1* | 2/2014 | Inoue | H03H 9/02637 333/133 |
| 2016/0072477 A1* | 3/2016 | Inoue | H03H 9/54 333/133 |
| 2016/0359468 A1* | 12/2016 | Taniguchi | H03H 9/02637 |
| 2017/0222624 A1 | 8/2017 | Kishino | |

FOREIGN PATENT DOCUMENTS

| | | | | |
|---|---|---|---|---|
| JP | 10-242799 A | * | 9/1998 | |
| JP | 2003-032080 A | | 1/2003 | |
| JP | 2003-087096 A | | 3/2003 | |
| JP | 2003087096 A | * | 3/2003 | |
| JP | 2005-191797 A | | 7/2005 | |
| JP | 2009-212572 A | | 9/2009 | |
| JP | 2014-039199 A | | 2/2014 | |
| WO | WO-2015151706 A1 | * | 10/2015 | ......... H03H 9/02921 |
| WO | 2016/017730 A1 | | 2/2016 | |

* cited by examiner

LADDER FILTER, DUPLEXER, AND ELASTIC WAVE FILTER DEVICE

CROSS REFERENCE TO RELATED APPLICATIONS

This application claims the benefit of priority to Japanese Patent Application No. 2016-211975 filed on Oct. 28, 2016 and is a Continuation Application of PCT Application No. PCT/JP2017/037018 filed on Oct. 12, 2017. The entire contents of each of these applications are hereby incorporated herein by reference.

BACKGROUND OF THE INVENTION

1. Field of the Invention

The present invention relates to a ladder filter, a duplexer including the ladder filter, and an elastic wave filter device including the ladder filter.

2. Description of the Related Art

Ladder filters are widely used as band pass filters or other filters of cellular phones. In a ladder filter described in Japanese Unexamined Patent Application Publication No. 2003-032080, an electrode finger center-to-center distance of mutually adjacent electrode fingers of an IDT electrode and reflector is less than 0.5λ in all series-arm resonators. λ is a wavelength that is determined by the electrode finger pitch of the IDT electrode. In the ladder filter, the electrode finger pitch of the reflector is greater than the electrode finger pitch of the IDT electrode. In Japanese Unexamined Patent Application Publication No. 2003-032080, with the above-described configuration, a ripple in a pass band is reduced.

On the other hand, in a ladder filter described in Japanese Unexamined Patent Application Publication No. 8-065089, a capacitor is connected in parallel with a series-arm resonator. Thus, steepness at higher frequencies in a pass band is improved.

In a duplexer, to attain good isolation characteristics, a large out-of-band attenuation is required for a transmission filter and a receiving filter, and specifically high attenuation characteristics of 50 dB or greater are required. However, in the ladder filter described in Japanese Unexamined Patent Application Publication No. 2003-032080, a frequency at which a ripple occurs decreases, and steepness tends to deteriorate. Thus, an out-of-band attenuation near the pass band also tends to deteriorate. Therefore, it is difficult for the ladder filter of Japanese Unexamined Patent Application Publication No. 2003-032080 to meet the above-described requirement on out-of-band attenuation.

To improve steepness, it is known that a capacitor is connected in parallel with a series-arm resonator as described in Japanese Unexamined Patent Application Publication No. 8-065089. However, in this case, the anti-resonant frequency of the series-arm resonator that is connected in parallel with the capacitor decreases. Therefore, the anti-resonant frequency of the series-arm resonator is close to the pass band, and therefore electric power handling capability tends to deteriorate.

SUMMARY OF THE INVENTION

Preferred embodiments of the present invention provide ladder filters, which are each able to attain good steepness and to sufficiently increase out-of-band attenuation without deterioration of electric power handling capability, and duplexers and elastic wave filter devices that are each able to improve isolation characteristics without deterioration of electric power handling capability.

A ladder filter according to a preferred embodiment of the present invention includes a plurality of series-arm resonators and a parallel-arm resonator. The plurality of series-arm resonators each includes an IDT electrode and a reflector. Each of the IDT electrode and the reflector includes a plurality of electrode fingers. In at least one of the plurality of series-arm resonators, where a wavelength that is determined by an electrode finger pitch of the IDT electrode is λ, an electrode finger center-to-center distance between an electrode finger located closest to the reflector among the plurality of electrode fingers of the IDT electrode and an electrode finger located closest to the IDT electrode among the plurality of electrode fingers of the reflector is less than about 0.5λ. An anti-resonant frequency of the at least one of the series-arm resonators is higher than an anti-resonant frequency of at least another one of the plurality of series-arm resonators.

In a ladder filter according to a preferred embodiment of the present invention, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about 0.4λ. In this case, steepness is increased, and out-of-band attenuation is further increased.

In a ladder filter according to a preferred embodiment of the present invention, in the at least one of the series-arm resonators, an electrode finger pitch of the reflector is less than an electrode finger pitch of the IDT electrode. In this case, a ripple in a pass band is reduced.

In a ladder filter according to a preferred embodiment of the present invention, the anti-resonant frequency of the at least one of the series-arm resonators is the highest among anti-resonant frequencies of the plurality of series-arm resonators. In this case, deterioration of electric power handling capability is further reduced. Out-of-band attenuation is further increased.

A duplexer according to a preferred embodiment of the present invention includes a transmission filter that is a ladder filter according to a preferred embodiment of the present invention, and a receiving filter having a pass band different from a pass band of the transmission filter.

An elastic wave filter device according to a preferred embodiment of the present invention includes a first band pass filter that is the ladder filter according to a preferred embodiment of the present invention, and at least one second band pass filter having a pass band different from a pass band of the first band pass filter.

With the ladder filters according to preferred embodiments of the present invention, good steepness is attained without deterioration of electric power handling capability, and out-of-band attenuation is also sufficiently increased.

With the duplexers and the elastic wave filter devices according to preferred embodiments of the present invention, isolation characteristics are improved without deterioration of electric power handling capability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be described by explaining specific preferred embodiments of the present invention with reference to the drawings.

It should be noted that preferred embodiments described in this specification are illustrative and replacement or combination of a portion of components is possible among the different preferred embodiments.

Figure 1:
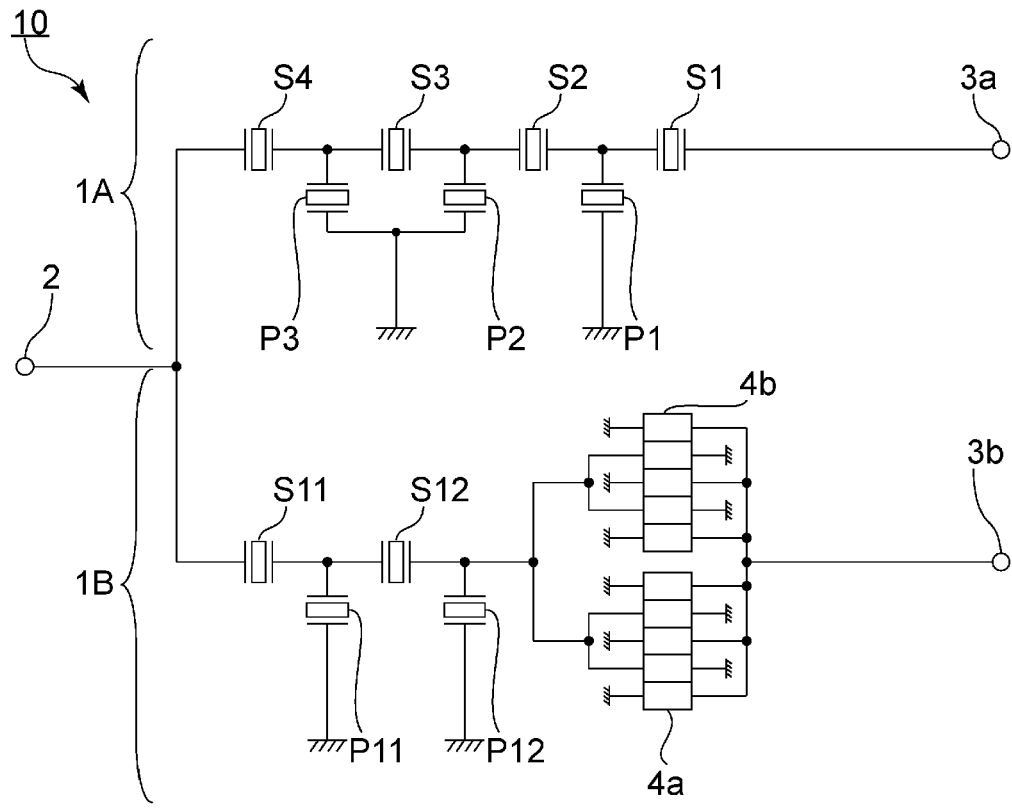
FIG. 1 is a circuit diagram of a duplexer according to a first preferred embodiment of the present invention.

FIG. 1 is a circuit diagram of a duplexer according to a first preferred embodiment of the present invention.

The duplexer 10 includes first and second signal terminals 3a, 3b, an antenna terminal 2 connected to an antenna, and a transmission filter 1A and a receiving filter 1B connected in common to the antenna terminal 2. The transmission filter 1A is a ladder filter according to a preferred embodiment of the present invention.

In the present preferred embodiment, the pass band of the transmission filter 1A is preferably, for example, uplink band 8, and is higher than or equal to about 880 MHz and lower than or equal to about 915 MHz. The pass band of the receiving filter 1B is preferably, for example, downlink band 8, and is higher than or equal to about 925 MHz and lower than or equal to about 960 MHz. The pass bands of the transmission filter 1A and the receiving filter 1B are not limited to the above-described bands.

The transmission filter 1A includes series-arm resonators S1 to S4 and parallel-arm resonators P1 to P3. Each of the series-arm resonators S1 to S4 and the parallel-arm resonators P1 to P3 is preferably an elastic wave resonator, for example. The series-arm resonators S1 to S4 are connected in series with one another between the antenna terminal 2 and the first signal terminal 3a. The parallel-arm resonator P1 is connected between a ground potential and a connection point between the series-arm resonator S1 and the series-arm resonator S2. The parallel-arm resonator P2 is connected between the ground potential and a connection point between the series-arm resonator S2 and the series-arm resonator S3. The parallel-arm resonator P3 is connected between the ground potential and a connection point between the series-arm resonator S3 and the series-arm resonator S4. The parallel-arm resonator P2 and the parallel-arm resonator P3 are connected in common to the ground potential.

The transmission filter 1A preferably includes a parallel-arm resonator and at least two series-arm resonators having different anti-resonant frequencies.

On the other hand, the receiving filter 1B includes first and second longitudinally-coupled resonator elastic wave filters 4a, 4b, and elastic wave resonators S11, S12, P11, P12 to adjust characteristics. The first longitudinally-coupled resonator elastic wave filter 4a and the second longitudinally-coupled resonator elastic wave filter 4b are connected in parallel with each other between the antenna terminal 2 and the second signal terminal 3b. The elastic wave resonators S11, S12 are connected in series with each other between the antenna terminal 2 and the first and second longitudinally-coupled resonator elastic wave filters 4a, 4b. The elastic wave resonator P11 is connected between the ground potential and a connection point between the elastic wave resonator S11 and the elastic wave resonator S12. The elastic wave resonator P12 is connected between the ground potential and a connection point between the elastic wave resonator S12 and the first and second longitudinally-coupled resonator elastic wave filters 4a, 4b.

The circuit configuration of the receiving filter 1B is not limited to the above configuration. The receiving filter 1B may preferably be, for example, a ladder filter.

In the present preferred embodiment, the anti-resonant frequencies of the series-arm resonators S1 to S4 are different from one another. More specifically, the anti-resonant frequency of the series-arm resonator S1 is preferably about 929 MHz, for example. The anti-resonant frequency of the series-arm resonator S2 is preferably about 931 MHz, for example. The anti-resonant frequency of the series-arm resonator S3 is preferably about 937 MHz for example. The anti-resonant frequency of the series-arm resonator S4 is preferably about 932 MHz, for example. The series-arm resonator S3 is a first series-arm resonator, which has an anti-resonant frequency higher than the other series-arm resonators. The series-arm resonators S1, S2, S4 are each a second series-arm resonator, which has an anti-resonant frequency lower than the first series-arm resonator. The first series-arm resonator preferably has an anti-resonant frequency higher than at least another one of the series-arm resonators. The transmission filter 1A preferably includes at least one first series-arm resonator.

Hereinafter, a specific configuration of the first series-arm resonator will be described.

Figure 2:
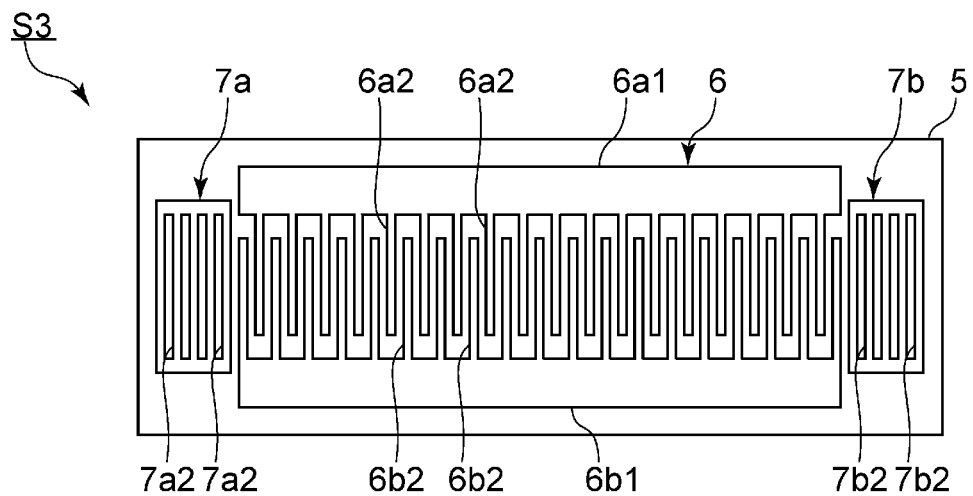
FIG. 2 is a schematic plan view for explaining the electrode configuration of a first series-arm resonator in the first preferred embodiment of the present invention.

FIG. 2 is a schematic plan view for illustrating the electrode configuration of the first series-arm resonator in the first preferred embodiment.

As shown in FIG. 2, the series-arm resonator S3 includes a piezoelectric substrate 5. The piezoelectric substrate 5 is preferably made of, for example, $LiNbO_3$. Alternatively, the piezoelectric substrate 5 may be made of a piezoelectric monocrystal other than $LiNbO_3$, such as $LiTaO_3$, or may be made of appropriate piezoelectric ceramics, for example.

An IDT electrode 6 is provided on the piezoelectric substrate 5. The IDT electrode 6 is preferably made of, for example, a multilayer metal film in which an Ni—Cr layer, a Pt layer, a Ti layer, and an Al—Cu layer are laminated from the piezoelectric substrate 5 side. The film thickness of the Ni—Cr layer is preferably about 10 nm, for example. The film thickness of the Pt layer is preferably about 300 nm, for example. The film thickness of the Ti layer is preferably about 10 nm, for example. The film thickness of the Al—Cu layer is preferably about 315 nm, for example. The configuration of the IDT electrode 6 is not limited to the above-described configuration. The IDT electrode 6 is preferably made of an appropriate metal or appropriate metals. For example, the IDT electrode 6 may be made of a single-layer metal film.

When voltage is applied to the IDT electrode 6, elastic waves are excited. Reflectors 7a, 7b are disposed on respective sides of the IDT electrode 6 in an elastic wave propagation direction. Thus, the series-arm resonator S3 is defined.

The IDT electrode 6 includes first and second busbars 6a1, 6b1 and pluralities of first and second electrode fingers 6a2, 6b2. The first busbar 6a1 and the second busbar 6b1 face each other. One ends of the plurality of first electrode fingers 6a2 are connected to the first busbar 6a1. One ends of the plurality of second electrode fingers 6b2 are connected to the second busbar 6b1. The plurality of first electrode fingers 6a2 and the plurality of second electrode fingers 6b2 are mutually interposed.

The reflectors 7a and 7b include a plurality of electrode fingers 7a2 and 7b2, respectively.

Figure 3:
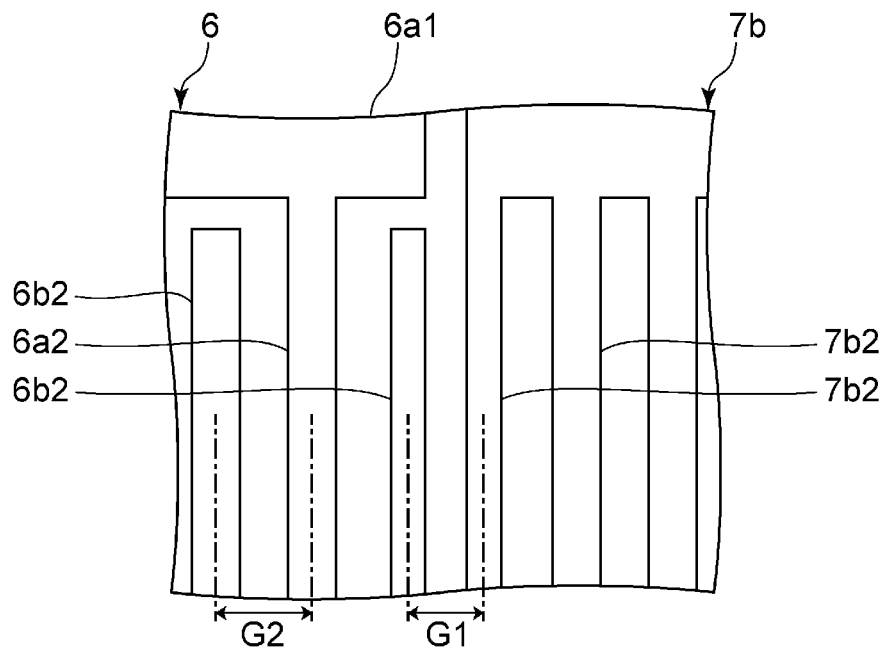
FIG. 3 is an enlarged schematic plan view showing an area around a portion of the first series-arm resonator between an IDT electrode and a reflector in the first preferred embodiment of the present invention.

FIG. 3 is an enlarged schematic plan view showing an area around a portion of the first series-arm resonator between the IDT electrode and the reflector in the first preferred embodiment.

A wavelength determined by the electrode finger pitch of the IDT electrode 6 is λ. At this time, an electrode finger center-to-center distance G2 between any adjacent first electrode finger 6a2 and second electrode finger 6b2 is preferably about 0.5λ, for example. An electrode finger center-to-center distance between an electrode finger located closest to a reflector among a plurality of electrode fingers of an IDT electrode and an electrode finger located closest to the IDT electrode among a plurality of electrode fingers of the reflector is an IDT electrode-reflector gap. In the present preferred embodiment, the IDT electrode-reflector gap G1 between the IDT electrode 6 and the reflector 7b is preferably about 0.38λ, for example. The IDT electrode-reflector gap between the reflector 7a and the IDT electrode 6, shown in FIG. 2, is also preferably about 0.38λ, for example.

Referring back to FIG. 1, each of the series-arm resonators S1, S2, S4 also includes an IDT electrode and reflectors. The IDT electrode-reflector gap of the series-arm resonator S1 is preferably about 0.5λ, for example. The IDT electrode-reflector gap of the series-arm resonator S2 is preferably about 0.5λ, for example. The IDT electrode-reflector gap of the series-arm resonator S4 is preferably about 0.52λ, for example.

On the other hand, in each of the series-arm resonators S1 to S4, the electrode finger pitch of the IDT electrode is different from the electrode finger pitch of each reflector. The quotient obtained by dividing an electrode finger pitch of an IDT electrode by an electrode finger pitch of a reflector is an IDT electrode-reflector pitch ratio. The IDT electrode-reflector pitch ratio of the series-arm resonator S1 is preferably about 0.999, for example. The IDT electrode-reflector pitch ratio of the series-arm resonator S2 is preferably about 0.998, for example. The IDT electrode-reflector pitch ratio of the series-arm resonator S3 is preferably about 1.006, for example. The IDT electrode-reflector pitch ratio of the series-arm resonator S4 is preferably about 0.936, for example.

The characteristics of preferred embodiments of the present invention are in the configuration that the IDT electrode-reflector gap of the series-arm resonator having an anti-resonant frequency higher than at least another one of the series-arm resonators is less than about 0.5λ. With this configuration, good steepness is attained and isolation characteristics are improved without deterioration of electric power handling capability. This will be described by way of a comparison between the present preferred embodiment and each of a first comparative example and a second comparative example.

Figure 4:
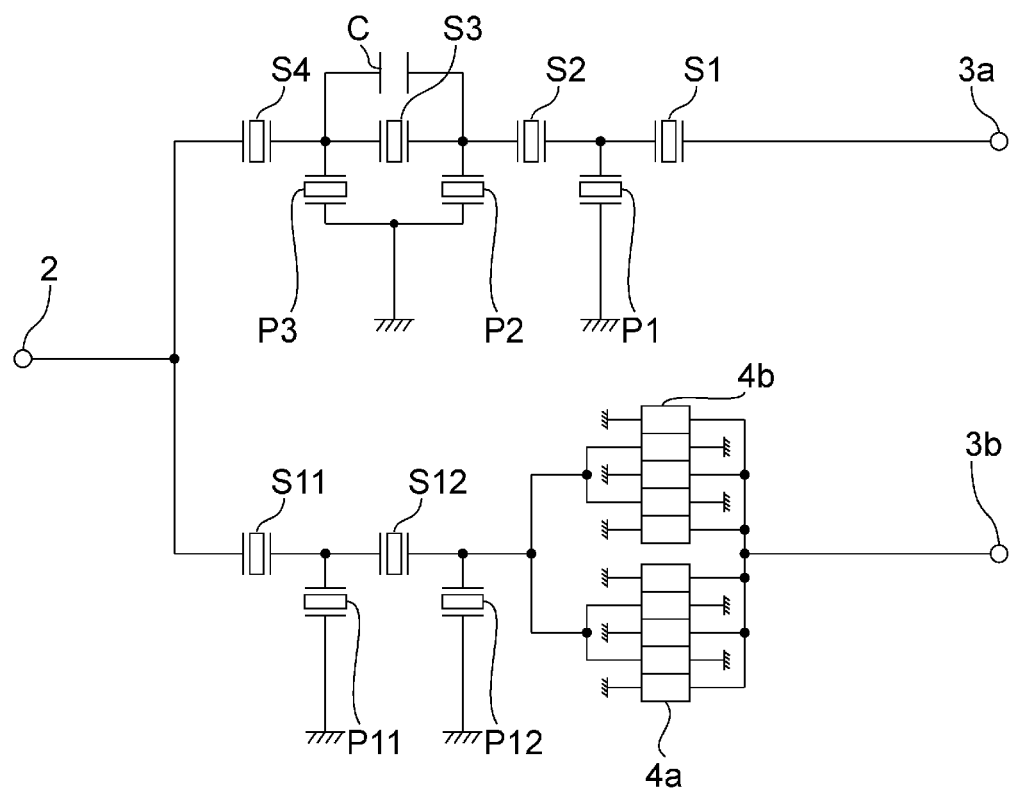
FIG. 4 is a circuit diagram of a duplexer of a first comparative example.

As shown in FIG. 4, a duplexer of the first comparative example differs in that a capacitor C is connected in parallel with the series-arm resonator S3. Furthermore, in the duplexer of the first comparative example, the anti-resonant frequency of the series-arm resonator S3, the IDT electrode-reflector gap, and the IDT electrode-reflector pitch ratio are different from those of the first preferred embodiment.

On the other hand, the circuit configuration of a duplexer of the second comparative example is the same or substantially the same as the circuit configuration of the first preferred embodiment. Hereinafter, the same reference signs to those of the series-arm resonators of the first preferred embodiment shown in FIG. 1 denote the series-arm resonators of the second comparative example. The second comparative example differs from the first preferred embodiment in that the IDT electrode-reflector gap of the series-arm resonator S1 having the lowest anti-resonant frequency is less than about 0.5λ and the IDT electrode-reflector gap of the series-arm resonator S3 is about 0.5λ.

The anti-resonant frequency of each of the series-arm resonators of the first preferred embodiment, the first comparative example, and the second comparative example is shown in Table 1. The IDT electrode-reflector gap of each of the series-arm resonators of the first preferred embodiment, the first comparative example, and the second comparative example is shown in Table 2. The IDT electrode-reflector pitch ratio of each of the series-arm resonators of the first preferred embodiment, the first comparative example, and the second comparative example is shown in Table 3.

TABLE 1

|  | SERIES-ARM RESONATOR S1 | SERIES-ARM RESONATOR S2 | SERIES-ARM RESONATOR S3 | SERIES-ARM RESONATOR S4 |
| --- | --- | --- | --- | --- |
| FIRST PREFERRED EMBODIMENT | 929 MHz | 931 MHz | 937 MHz | 932 MHz |
| FIRST COMPARATIVE EXAMPLE | 929 MHz | 931 MHz | 924 MHz | 932 MHz |
| SECOND COMPARATIVE EXAMPLE | 929 MHz | 931 MHz | 937 MHz | 932 MHz |

TABLE 2

|  | SERIES-ARM RESONATOR S1 | SERIES-ARM RESONATOR S2 | SERIES-ARM RESONATOR S3 | SERIES-ARM RESONATOR S4 |
| --- | --- | --- | --- | --- |
| FIRST PREFERRED EMBODIMENT | 0.5λ | 0.5λ | 0.38λ | 0.52λ |
| FIRST COMPARATIVE EXAMPLE | 0.5λ | 0.5λ | 0.5λ | 0.52λ |
| SECOND COMPARATIVE EXAMPLE | 0.37λ | 0.5λ | 0.5λ | 0.52λ |

TABLE 3

|  | SERIES-ARM RESONATOR S1 | SERIES-ARM RESONATOR S2 | SERIES-ARM RESONATOR S3 | SERIES-ARM RESONATOR S4 |
| --- | --- | --- | --- | --- |
| FIRST PREFERRED EMBODIMENT | 0.999 | 0.998 | 1.006 | 0.936 |
| FIRST COMPARATIVE EXAMPLE | 0.999 | 0.998 | 1 | 0.936 |
| SECOND COMPARATIVE EXAMPLE | 0.999 | 0.998 | 1.006 | 0.936 |

Figure 5:
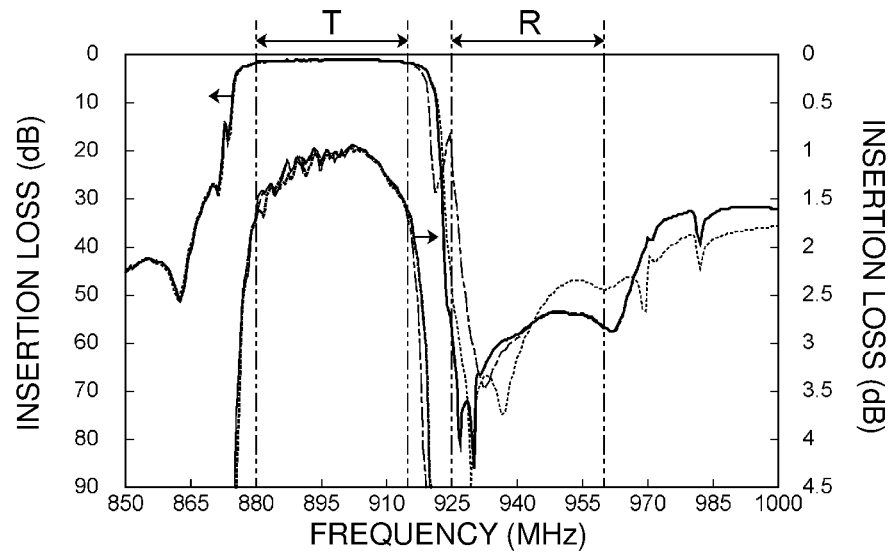
FIG. 5 is a graph showing the attenuation-frequency characteristics of a transmission filter in the first preferred embodiment of the present invention and the attenuation-frequency characteristics of transmission filters in first and second comparative examples.
Figure 6:
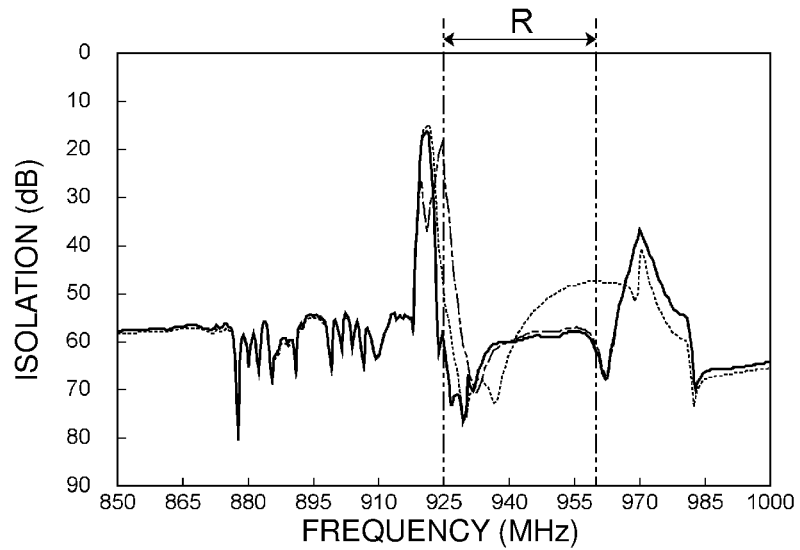
FIG. 6 is a graph showing the isolation characteristics of the duplexer of the first preferred embodiment of the present invention and the isolation characteristics of duplexers of the first and second comparative examples.

FIG. 5 is a graph showing the attenuation-frequency characteristics of the transmission filter in the first preferred embodiment and the attenuation-frequency characteristics of transmission filters in the first and second comparative examples. FIG. 6 is a graph showing the isolation characteristics of the duplexer of the first preferred embodiment and the isolation characteristics of duplexers of the first and second comparative examples. The band T in FIG. 5 represents the pass band of each transmission filter. The band R in FIG. 5 and FIG. 6 represents the pass band of each receiving filter. This also applies to the graphs showing the attenuation-frequency characteristics and the graphs showing the isolation characteristics in the following description. In FIG. 5 and FIG. 6, the solid lines represent the results of the first preferred embodiment, the dashed lines represent the results of the first comparative example, and the alternate long and short dashed lines represent the results of the second comparative example.

As shown in FIG. 5, in the transmission filter of the first comparative example, steepness around the higher frequency-side end of the pass band is about 7.3 MHz. The above-described steepness of the second comparative example is about 11.2 MHz. In this specification, steepness means the difference between a frequency at which the attenuation is about 2.5 dB and a frequency at which the attenuation is about 50 dB. In the first comparative example, the attenuation of the transmission filter in the pass band of the receiving filter is about 46.9 dB. In the second comparative example, the attenuation of the transmission filter in the pass band of the receiving filter is about 20.6 dB.

As shown in FIG. 6, isolation in the first comparative example is about 47.2 dB. Isolation in the second comparative example is about 22.6 dB.

In a duplexer, the attenuation of one band pass filter in a pass band of the other band pass filter is often required to be greater than or equal to about 50 dB. Furthermore, in a duplexer, isolation is often required to be greater than or equal to about 50 dB. The first and second comparative examples do not meet these requirements.

In the first comparative example, as shown in FIG. 4, the capacitor C is connected in parallel with the series-arm resonator S3. Thus, as shown in Table 1, the anti-resonant frequency of the series-arm resonator S3 is low. The anti-resonant frequency of the series-arm resonator S3 is located outside the pass band of the receiving filter. Therefore, the attenuation of the transmission filter in the pass band of the receiving filter is small, and thus the isolation characteristics are deteriorated.

In the second comparative example, as shown in Table 2, the IDT electrode-reflector gap of the series-arm resonator S1 is the smallest. Since the IDT electrode-reflector gap is less than about 0.5λ, a ripple occurs between the resonant frequency and the anti-resonant frequency. In the second comparative example, a ripple occurs around a frequency of about 921 MHz. Therefore, steepness is deteriorated, the attenuation of the transmission filter in the pass band of the receiving filter is small, and thus the isolation characteristics are deteriorated.

In contrast, as shown in FIG. 5, in the transmission filter of the first preferred embodiment, steepness on the higher frequency side of the pass band is about 5.8 MHz, and therefore steepness is improved. The attenuation of the transmission filter in the pass band of the receiving filter is about 53.4 dB. As shown in FIG. 6, isolation is about 57.6 dB. In this manner, the first preferred embodiment meets the above-described requirements.

In the first preferred embodiment, as shown in Table 1 and Table 2, the IDT electrode-reflector gap of the series-arm resonator S3 having the highest anti-resonant frequency among the plurality of series-arm resonators is less than about 0.5λ. Thus, a ripple due to the IDT electrode-reflector gap occurs at a higher frequency side. With this, steepness is improved as described above. In addition to this, since the anti-resonant frequency of the series-arm resonator S3 is high and is located within the pass band of the receiving filter, the attenuation of the transmission filter in the pass band is increased, and the isolation characteristics are improved.

The IDT electrode-reflector gap of the series-arm resonator S3 is preferably less than about 0.4λ, for example. As the IDT electrode-reflector gap reduces, the frequency of occurrence of ripple due to the IDT electrode-reflector gap increases. Thus, a ripple occurs near an attenuation pole away from the pass band toward the higher frequency side. With this, steepness is further increased. Thus, the attenuation of the transmission filter in the pass band of the receiving filter is further increased, and therefore the isolation characteristics are also further improved.

The IDT electrode-reflector gap is preferably greater than or equal to about 0.2λ, for example. The IDT electrode-reflector gap is more preferably greater than or equal to about 0.3λ, for example. In this case, productivity is increased.

The duplexer of the first preferred embodiment and the duplexer of the first comparative example were manufactured. Electric power at about 915 MHz located at the higher frequency-side end of the pass band of the transmission filter was applied to these duplexers, and then the electric power handling capabilities were compared.

Figure 7:
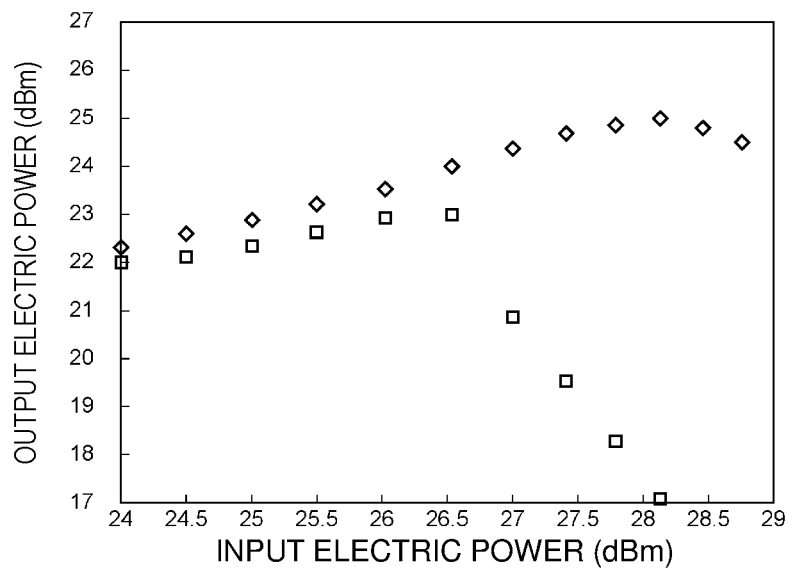
FIG. 7 is a graph showing the electric power handling capability of the duplexer in the first preferred embodiment of the present invention and the electric power handling capability of the duplexer in the first comparative example.

FIG. 7 is a graph showing the electric power handling capability of the duplexer in the first preferred embodiment and the electric power handling capability of the duplexer in the first comparative example. The rhombus plots represent the results of the first preferred embodiment. The square plots represent the results of the first comparative example.

As shown in FIG. 7, in the first comparative example, as the input electric power exceeds about 26.5 dBm, the output electric power steeply deteriorates. In contrast, in the first preferred embodiment, up to an input electric power of about 28.1 dBm, as the input electric power increases, the output electric power increases. Even around the input electric power at which the input electric power exceeds about 28.1 dBm, a steep decrease in output electric power does not occurs. In addition, in the first preferred embodiment, in all of the range of the input electric power shown in FIG. 7, the output electric power is maintained higher than the output electric power in the first comparative example. In the first preferred embodiment, at about 28.1 dBm, the output electric power is about 25 dBm. In this manner, in the first preferred embodiment, it was discovered that deterioration of electric power handling capability is reduced and the output electric power is sufficiently increased.

Incidentally, in an elastic wave device, such as a duplexer, frequency decreases because of temperature drift under high-temperature conditions. As a result of such a change in frequency, a loss tends to increase. When the input electric power is increased, the elastic wave device further generates heat, and therefore, the loss caused by temperature drift tends to further increase. As a result of an increase in the loss due to temperature drift, when the input electric power exceeds a certain value, the output electric power decreases as the input electric power increases.

In the series-arm resonator, the loss increases as the frequency of the input electric power gets closer to the anti-resonant frequency, and the series-arm resonator more easily generates heat. In the first comparative example, since the capacitor C is connected in parallel with the series-arm resonator S3 as shown in FIG. 4 to improve steepness, the anti-resonant frequency of the series-arm resonator S3 decreases. Therefore, the anti-resonant frequency of the series-arm resonator S3 is close to about 915 MHz that is the frequency of input electric power in the evaluation shown in FIG. 7. Thus, in the first comparative example, the temperature was high even at low input electric power, and the output electric power was significantly deteriorated because of the large loss due to temperature drift.

In contrast, in the first preferred embodiment, no capacitor is provided, and the anti-resonant frequency of the series-arm resonator is increased. Thus, in the series-arm resonator, less heat is generated, and therefore, the electric power handling capability is less deteriorated.

Referring back to FIG. 1, the series-arm resonator S3 that defines and functions as the first series-arm resonator preferably has the highest anti-resonant frequency among the plurality of series-arm resonators S1 to S4. With this structure, in the duplexer 10, deterioration of the electric power handling capability is effectively reduced, and the isolation characteristics are effectively improved. In the transmission filter 1A, deterioration of the electric power handling capability is effectively reduced, and the out-of-band attenuation in the pass band of the receiving filter 1B is effectively increased.

The first series-arm resonator preferably has an anti-resonant frequency higher than at least another one of the series-arm resonators. Thus, in the duplexer 10, the isolation characteristics are sufficiently increased without deterioration of electric power handling capability. In the transmission filter 1A, the out-of-band attenuation in the pass band of the receiving filter 1B is sufficiently increased without deterioration of electric power handling capability.

Incidentally, the IDT electrode-reflector gap of the series-arm resonator S3 is preferably less than about 0.5λ, for example, and is less than the electrode finger pitch of the IDT electrode. As shown in FIG. 3, the width of the electrode finger located closest to the reflector 7b among the plurality of electrode fingers of the IDT electrode 6 is preferably narrower than the width of each of the other first and second electrode fingers 6a2, 6b2. The width of each electrode finger is the dimension of each electrode finger along a direction perpendicular or substantially perpendicular to a direction in which the electrode finger extends. The width of the electrode finger located closest to the IDT electrode 6 among the plurality of electrode fingers of the reflector 7b is also preferably narrower than the width of each of the other electrode fingers 7b2. With this, the distance is increased between the reflector 7b-side edge of the electrode finger located closest to the reflector 7b among the plurality of electrode fingers of the IDT electrode 6 and the IDT electrode 6-side edge of the electrode finger located closest to the IDT electrode 6 among the plurality of electrode fingers of the reflector 7b. Thus, for example, when the IDT electrode 6 and the reflector 7b are formed by lift-off, formation failure rarely occurs.

Alternatively, an electrode film may be provided between the electrode finger located closest to the reflector 7b among the plurality of electrode fingers of the IDT electrode 6 and the electrode finger located closest to the IDT electrode 6 among the plurality of electrode fingers of the reflector 7b, and the above-described electrode fingers and the electrode film may be connected so as to be integrated with one another. In this case as well, in a lift-off process, formation failure of the IDT electrode 6 and the reflector 7b rarely occurs. As in the case of the first preferred embodiment, the width of the above-described electrode fingers are preferably narrowed. In this case, in a lift-off process, formation failure of the IDT electrode 6 and the reflector 7b rarely occurs, and electromigration at the time of application of electric power is also less likely to occur, and therefore the electric power handling capability is increased.

This also applies to the electrode finger located closest to the IDT electrode 6 among the plurality of electrode fingers of the reflector 7a shown in FIG. 2 and the electrode finger located closest to the reflector 7a among the plurality of electrode fingers of the IDT electrode 6 shown in FIG. 2.

In the first preferred embodiment, the IDT electrode-reflector gap of the series-arm resonator S3 is preferably less than about 0.5λ, for example. Thus, as described above, a ripple occurs between the resonant frequency and the anti-resonant frequency. At the same time, a ripple due to the reflectors 7a, 7b also occurs on the lower frequency side than the resonant frequency. Therefore, a ripple occurs at the lower frequency side in the pass band of the transmission filter. As shown in Table 3, the IDT electrode-reflector pitch ratio of the series-arm resonator S3 is greater than about 1. In this manner, in the series-arm resonator S3, the electrode finger pitch of each of the reflectors 7a, 7b is preferably less than the electrode finger pitch of the IDT electrode 6. With this, a ripple in the pass band of the transmission filter is reduced. This will be described below.

A plurality of duplexers having different IDT electrode-reflector pitch ratios were prepared. The IDT electrode-reflector pitch ratios were respectively about 1.006, about 1, and about 0.996. These duplexers are referred to as duplexer X, duplexer Y, and duplexer Z. The duplexer X having an IDT electrode-reflector pitch ratio of about 1.006 is a duplexer having the configuration of the first preferred embodiment. In the duplexer Y having an IDT electrode-reflector pitch ratio of about 1, the IDT electrode-reflector gap was set to about 0.37λ to match the frequency, at which a ripple occurs, with the duplexer of the first preferred embodiment. In the duplexer Z having an IDT electrode-reflector pitch ratio of about 0.996, the IDT electrode-reflector gap was set to about 0.36λ to match the frequency, at which a ripple occurs, with the duplexer of the first preferred embodiment. This setting is shown in Table 4.

TABLE 4

| | SERIES-ARM RESONATOR S3 | |
| --- | --- | --- |
| | IDT ELECTRODE-REFLECTOR GAP | IDT ELECTRODE-REFLECTOR PITCH RATIO |
| DUPLEXER X | 0.38λ | 1.006 |
| DUPLEXER Y | 0.37λ | 1 |
| DUPLEXER Z | 0.36λ | 0.996 |

The duplexers Y, Z have a similar configuration to that of the first preferred embodiment except the IDT electrode-reflector gap and IDT electrode-reflector pitch ratio of the series-arm resonator S3. The attenuation-frequency characteristics and isolation characteristics of the duplexers X, Y, Z were compared with one another.

Figure 8:
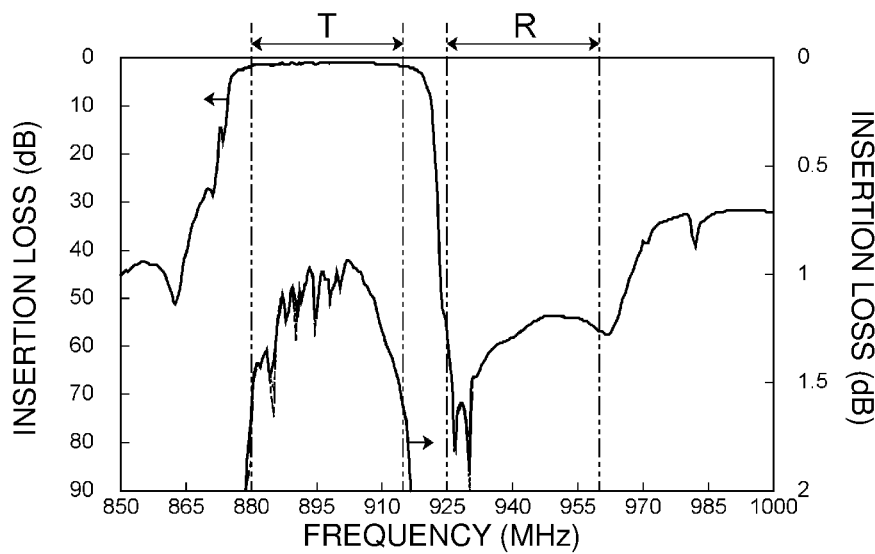
FIG. 8 is a graph showing the attenuation-frequency characteristics of transmission filters in duplexers according to preferred embodiments of the present invention having different IDT electrode-reflector pitch ratios.
Figure 9:
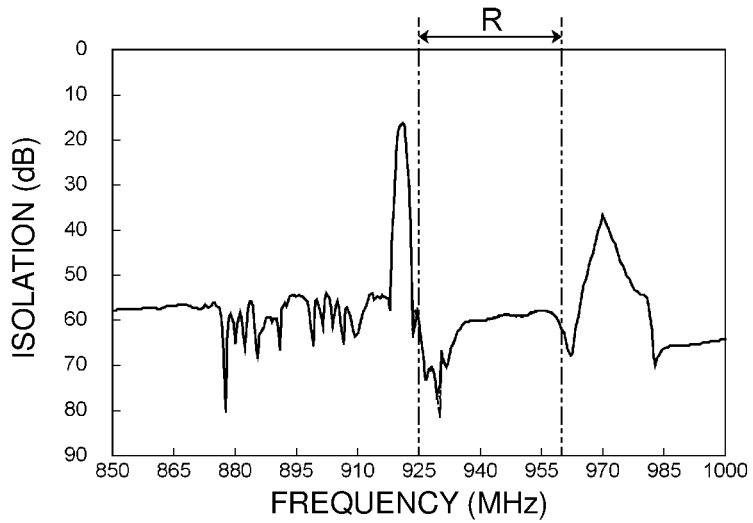
FIG. 9 is a graph showing the isolation characteristics of duplexers according to preferred embodiments of the present invention having different IDT electrode-reflector pitch ratios.

FIG. 8 is a graph showing the attenuation-frequency characteristics of the transmission filters in the duplexers having different IDT electrode-reflector pitch ratios. FIG. 9 is a graph showing the isolation characteristics of the duplexers having different IDT electrode-reflector pitch ratios. In FIG. 8 and FIG. 9, the solid lines represent the results of the case in which the IDT electrode-reflector pitch ratio is about 1.006, the dashed lines represent the results of the case where the IDT electrode-reflector pitch ratio is about 1, and the alternate long and short dashed lines represent the results of the case where the IDT electrode-reflector pitch ratio is about 0.996.

As shown in FIG. 8 and FIG. 9, it was discovered that, even when the IDT electrode-reflector pitch ratios are different, the attenuation and isolation characteristics of the transmission filter in the pass band of the receiving filter remain almost unchanged.

As shown in FIG. 8, when the IDT electrode-reflector pitch ratios are different, the magnitude of a ripple in the pass band of the transmission filter varies. A ripple variation having an approximately 5 MHz band width means a difference between a larger attenuation at a peak and a smaller attenuation at a peak, of a ripple within the 5 MHz band width. When the IDT electrode-reflector pitch ratio is about 0.996, the ripple variation is about 0.56 dB. When the IDT electrode-reflector pitch ratio is about 1, the ripple variation is about 0.43 dB. When the IDT electrode-reflector pitch ratio is about 1.006, the ripple variation is about 0.34 dB. In this manner, it was discovered that, when the IDT electrode-reflector pitch ratio is set so as to be greater than about 1, a ripple is effectively reduced.

The ripple increases when the resonant frequency is located around the center of the stop band of the reflector. In contrast, when the electrode finger pitch of the reflector is narrowed, the lower frequency-side end of the stop band of the reflector is shifted to a higher frequency side, and the resonant frequency is able to be located around the lower frequency-side end of the stop band of the reflector. With this, the Q value of a ripple is deteriorated, and thus, the ripple is reduced. Therefore, as described above, when the IDT electrode-reflector pitch ratio is increased, a ripple is reduced.

The duplexer 10 of the first preferred embodiment is a duplexer preferably having a wafer level package (WLP) structure, for example. The structure of the duplexer 10 is not limited to the WLP structure, and may be, for example, a chip size package (CSP) structure or another structure.

Hereinafter, a duplexer according to a second preferred embodiment of the present will be described.

The circuit configuration of the duplexer according to the second preferred embodiment is the same or substantially the same as that of the first embodiment. Hereinafter, the same reference signs to those of the series-arm resonators of the first preferred embodiment shown in FIG. 1 denote the series-arm resonators of the second preferred embodiment. In the second preferred embodiment, the IDT electrode-reflector gap and IDT electrode-reflector pitch ratio of each of the series-arm resonators S2, S3 are different from those of the first preferred embodiment. More specifically, for example, the IDT electrode-reflector gap of the series-arm resonator S2 is preferably about 0.37λ, and the IDT electrode-reflector gap of the series-arm resonator S3 is preferably about 0.5λ. The IDT electrode-reflector pitch ratio of the series-arm resonator S2 is preferably about 1.006, for example, and the IDT electrode-reflector pitch ratio of the series-arm resonator S3 is preferably about 1, for example. This is shown in Table 5.

TABLE 5

| | IDT ELECTRODE-REFLECTOR GAP | | IDT ELECTRODE-REFLECTOR PITCH RATIO | |
| --- | --- | --- | --- | --- |
| | SERIES-ARM RESONATOR S2 | SERIES-ARM RESONATOR S3 | SERIES-ARM RESONATOR S2 | SERIES-ARM RESONATOR S3 |
| FIRST PREFERRED EMBODIMENT | 0.5λ | 0.38λ | 0.998 | 1.006 |
| SECOND PREFERRED EMBODIMENT | 0.37λ | 0.5λ | 1.006 | 1 |

In the second preferred embodiment, not the series-arm resonator having the highest anti-resonant frequency among the plurality of series-arm resonators but the series-arm resonator S2 having the anti-resonant frequency higher than the series-arm resonator S1 is the first series-arm resonator. The series-arm resonator S1, as in the case of the first preferred embodiment, is the second series-arm resonator.

Figure 10:
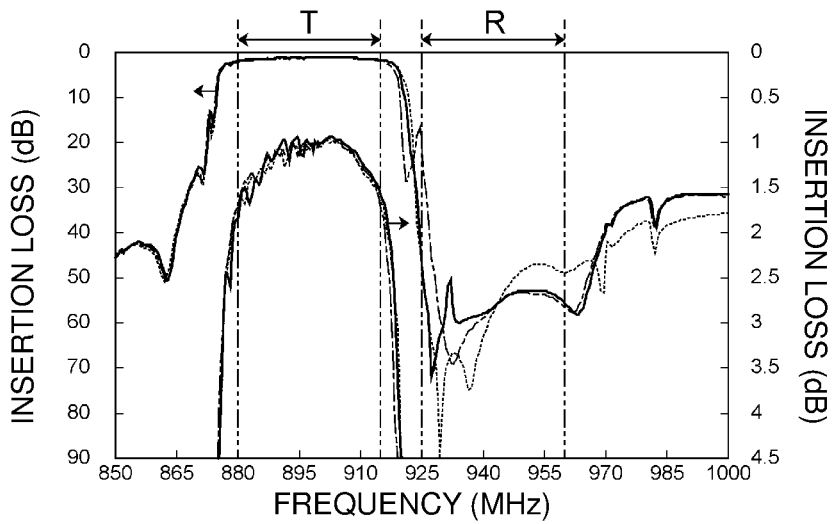
FIG. 10 is a graph showing the attenuation-frequency characteristics of a transmission filter in a second preferred embodiment of the present invention and the attenuation-frequency characteristics of the transmission filters in the first and second comparative examples.
Figure 11:
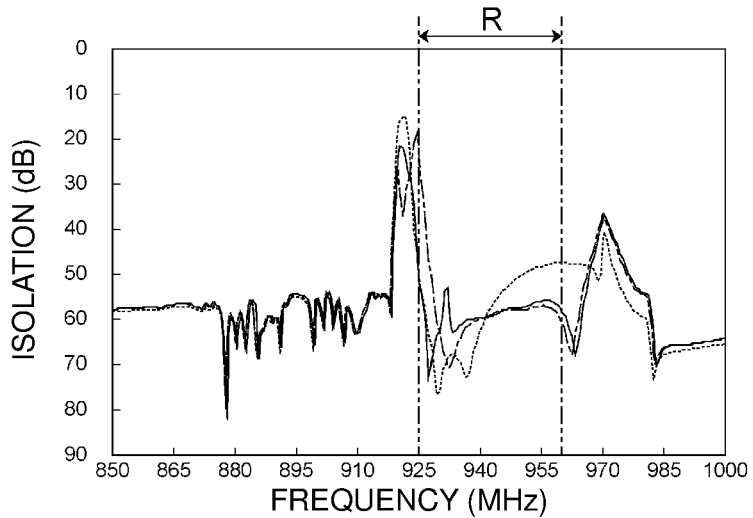
FIG. 11 is a graph showing the isolation characteristics of a duplexer of the second preferred embodiment of the present invention and the isolation characteristics of the duplexers of the first and second comparative examples.

FIG. 10 is a graph showing the attenuation-frequency characteristics of a transmission filter in the second preferred embodiment and the attenuation-frequency characteristics of the transmission filters in the first and second comparative examples. FIG. 11 is a graph showing the isolation characteristics of the duplexer of the second preferred embodiment and the isolation characteristics of the duplexers of the first and second comparative examples. In FIG. 10 and FIG. 11, the solid lines represent the results of the second preferred embodiment, the dashed lines represent the results of the first comparative example, and the alternate long and short dashed lines represent the results of the second comparative example.

As shown in FIG. 10, in the second preferred embodiment, steepness around the higher frequency-side end of the pass band of the transmission filter is about 7.2 MHz. The attenuation of the transmission filter in the pass band of the receiving filter is about 49 dB. In this manner, in the second preferred embodiment, as compared to the first and second comparative examples, steepness on the higher frequency side of the pass band is improved, and the attenuation of the transmission filter in the pass band of the receiving filter is increased.

As shown in FIG. 11, in the second preferred embodiment, isolation is about 51.5 dB, and therefore the isolation characteristics are improved. In addition, in the second preferred embodiment as well, as in the case of the first preferred embodiment, deterioration of the electric power handling capability is reduced.

Hereinafter, a duplexer according to a third preferred embodiment of the present invention will be described.

The circuit configuration of the duplexer according to the third preferred embodiment is the same or substantially the same as that of the first preferred embodiment. Hereinafter, the same reference signs to those of the series-arm resonators of the first preferred embodiment shown in FIG. 1 denote the series-arm resonators of the third preferred embodiment. In the third preferred embodiment, the IDT electrode-reflector gap of the series-arm resonator S3 is different from that of the first preferred embodiment. More specifically, the IDT electrode-reflector gap of the series-arm resonator S3 is preferably about 0.41λ, for example. In the present preferred embodiment as well, the series-arm resonator S3 is the first series-arm resonator.

Figure 12:
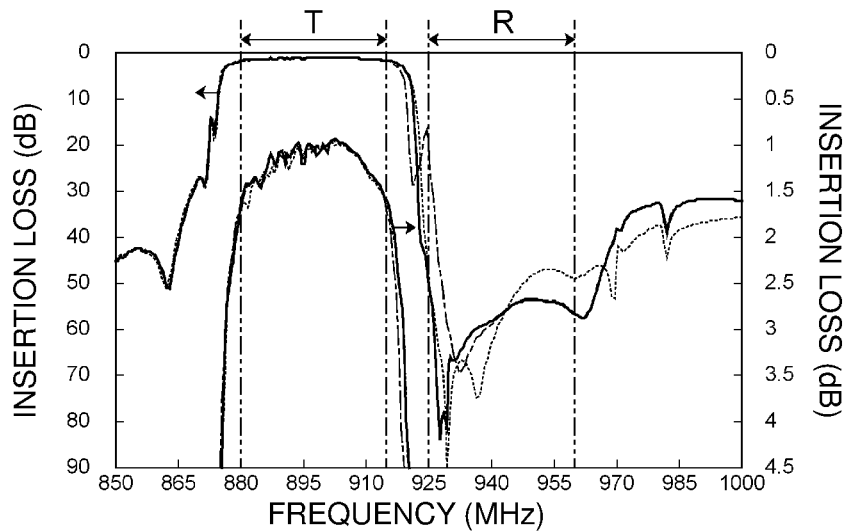
FIG. 12 is a graph showing the attenuation-frequency characteristics of a transmission filter in a third preferred embodiment of the present invention and the attenuation-frequency characteristics of the transmission filters in the first and second comparative examples.
Figure 13:
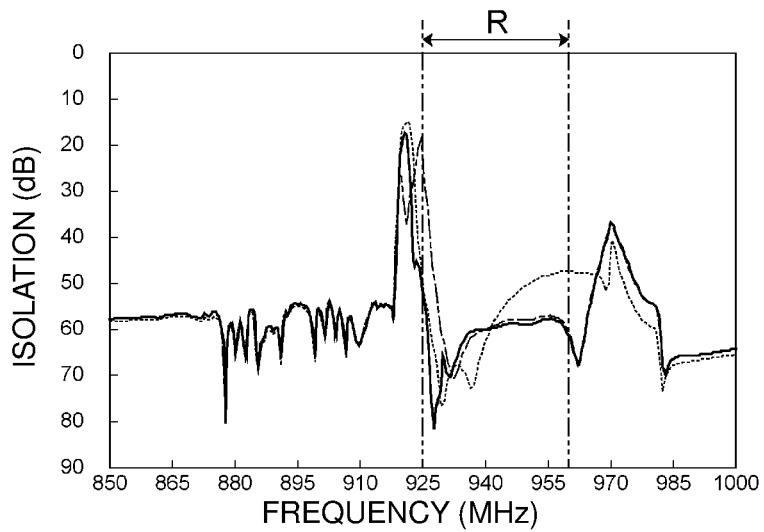
FIG. 13 is a graph showing the isolation characteristics of a duplexer of the third preferred embodiment of the present invention and the isolation characteristics of the duplexers of the first and second comparative examples.

FIG. 12 is a graph showing the attenuation-frequency characteristics of a transmission filter in the third preferred embodiment and the attenuation-frequency characteristics of the transmission filters in the first and second comparative examples. FIG. 13 is a graph showing the isolation characteristics of the duplexer of the third preferred embodiment and the isolation characteristics of the duplexers of the first and second comparative examples. In FIG. 12 and FIG. 13, the solid lines represent the results of the third preferred embodiment, the dashed lines represent the results of the first comparative example, and the alternate long and short dashed lines represent the results of the second comparative example.

As shown in FIG. 12, in the third preferred embodiment, steepness around the higher frequency-side end of the pass band of the transmission filter is about 7.1 MHz. The attenuation of the transmission filter in the pass band of the receiving filter is about 49.5 dB. In this manner, in the third preferred embodiment, as compared to the first and second comparative examples, steepness on the higher frequency side of the pass band is improved, and the attenuation of the transmission filter in the pass band of the receiving filter is increased.

As shown in FIG. 13, in the third preferred embodiment, isolation is about 51.5 dB, and therefore the isolation characteristics are improved. In addition, in the third preferred embodiment as well, as in the case of the first preferred embodiment, deterioration of the electric power handling capability is reduced.

Figure 14:
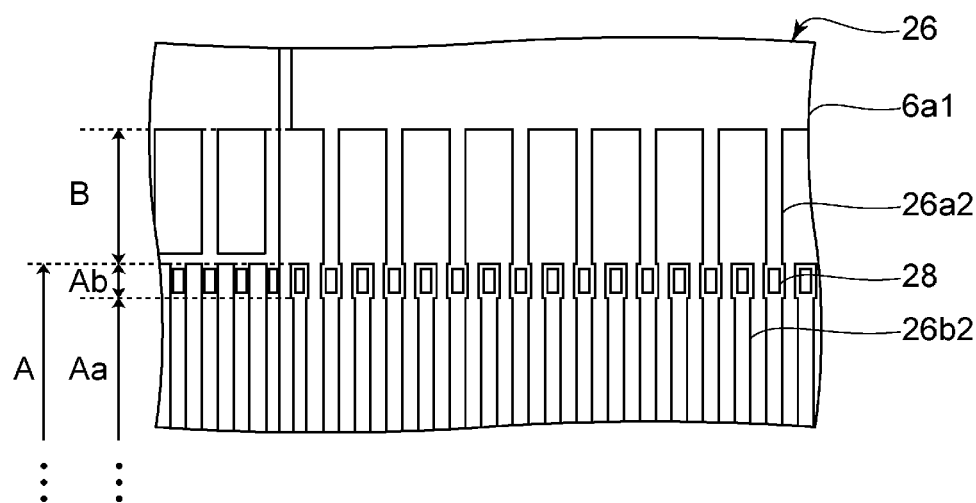
FIG. 14 is an enlarged schematic plan view showing the electrode configuration of a first series-arm resonator in a fourth preferred embodiment of the present invention.

FIG. 14 is an enlarged schematic plan view showing the electrode configuration of a first series-arm resonator in a fourth preferred embodiment of the present invention.

A duplexer according to the fourth preferred embodiment differs from that of the first preferred embodiment in the configuration of each of the series-arm resonators in a transmission filter. Other than the above point, the duplexer of the fourth preferred embodiment has the same or a similar configuration to that of the duplexer 10 of the first preferred embodiment. The anti-resonant frequency, IDT electrode-reflector gap, and IDT electrode-reflector pitch ratio of each of the series-arm resonators of the present preferred embodiment are similar to those of the first preferred embodiment.

More specifically, in the present preferred embodiment, the IDT electrode of each series-arm resonator includes a center region, a low acoustic velocity region, and a high acoustic velocity region shown below. This will be described by taking the first series-arm resonator shown in FIG. 14 as an example.

As shown in FIG. 14, when viewed in an elastic wave propagation direction, an IDT electrode 26 includes an overlapping region A that is a portion at which first electrode fingers 26a2 and second electrode fingers 26b2 overlap each other. A direction in which the first and second electrode fingers 26a2, 26b2 extend is defined as a longitudinal direction. At this time, the overlapping region A includes the center region Aa located at the center or approximate center in the longitudinal direction. The overlapping region A includes the low acoustic velocity regions Ab disposed on both sides of the center region Aa in the longitudinal direction. The center region Aa is a region surrounded by the two low acoustic velocity regions Ab in the longitudinal direction. An acoustic velocity V2 in the low acoustic velocity region Ab is lower than an acoustic velocity V1 in the center region Aa.

In the low acoustic velocity regions Ab, the width of each of the first and second electrode fingers 26a2, 26b2 is wider than the width of the other portions. Thus, the acoustic velocity is decreased. Furthermore, in each low acoustic velocity region Ab, a mass addition member 28 is provided on each of the first and second electrode fingers 26a2, 26b2. With this, the acoustic velocity is further decreased. The mass addition members 28 are preferably made of, for example, an appropriate metal or dielectric.

The configuration to decrease the acoustic velocity in each low acoustic velocity region Ab is not specifically limited. For example, at least one of the configuration that the width of each electrode finger in each low acoustic velocity region Ab is wider than the width of each of the other portions and the configuration that the mass addition members 28 are included may be provided.

The IDT electrode 26 includes the high acoustic velocity region B located between the first busbar 6a1 and the low acoustic velocity region Ab. An acoustic velocity V3 in the high acoustic velocity region is higher than the acoustic velocity V1 in the center region Aa. Similarly, the IDT electrode 26 also includes the high acoustic velocity region located between the second busbar and the second busbar-side low acoustic velocity region.

Since the IDT electrode 26 includes the low acoustic velocity regions Ab, the center region Aa, and the high acoustic velocity regions B preferably having the relationship that V2<V1<V3, the energy of elastic waves is effectively trapped. The series-arm resonators other than the series-arm resonator shown in FIG. 14 and the parallel-arm resonators each also include low acoustic velocity regions, a center region, and high acoustic velocity regions.

In the present preferred embodiment as well, since the IDT electrode-reflector gap of the first series-arm resonator is less than about 0.5λ, the out-of-band attenuation is sufficiently increased without deterioration of electric power handling capability.

Figure 15:
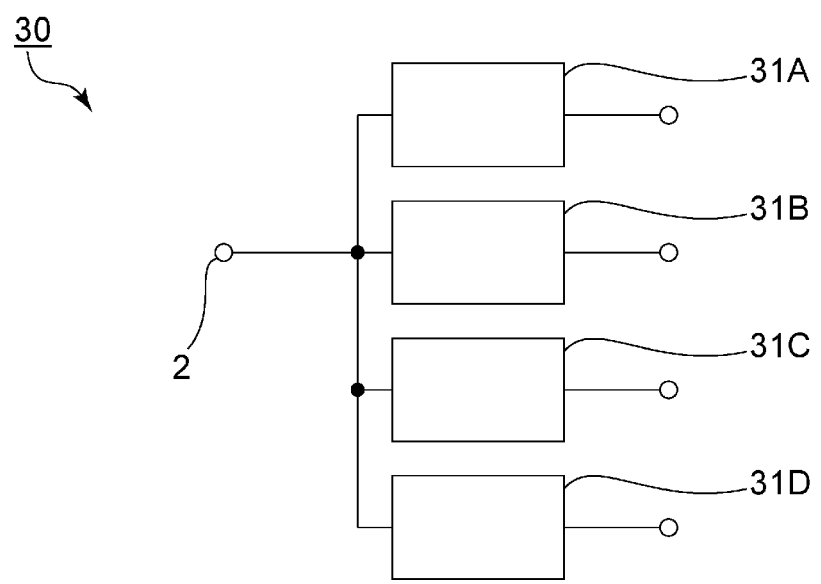
FIG. 15 is a schematic diagram of an elastic wave filter device according to a fifth preferred embodiment of the present invention.

FIG. 15 is a schematic diagram of an elastic wave filter device according to a fifth preferred embodiment of the present invention.

The elastic wave filter device 30 includes a first band pass filter 31A connected to the antenna terminal 2. The first band pass filter 31A has a similar configuration to that of the transmission filter 1A in the first preferred embodiment. The first band pass filter 31A may be a transmission filter or may be a receiving filter. The first band pass filter 31A, as in the case of the first preferred embodiment, has sufficiently high electric power handling capability, and therefore the first band pass filter 31A is preferably a transmission filter.

The elastic wave filter device 30 includes a plurality of second band pass filters 31B to 31D connected in common to the antenna terminal 2 together with the first band pass filter 31A. The plurality of second band pass filters 31B to 31D are different in pass band from the first band pass filter 31A. The pass band also varies among the plurality of second band pass filters 31B to 31D. The circuit configuration and other configuration of the plurality of second band pass filters 31B to 31D are not specifically limited.

Since the elastic wave filter device 30 includes the first band pass filter 31A having a similar configuration to that of the transmission filter 1A of the first preferred embodiment, the isolation characteristics are improved without deterioration of electric power handling capability.

The elastic wave filter device 30 preferably includes at least one second band pass filter. In this manner, the elastic wave filter device 30 may preferably be an elastic wave filter device including two band pass filters or may be a multiplexer including three or more band pass filters, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
  a plurality of series-arm resonators each including an IDT electrode and a reflector; and
  a parallel-arm resonator; wherein
  each of the IDT electrode and the reflector includes a plurality of electrode fingers;
  in at least one of the plurality of series-arm resonators, where a wavelength that is determined by an electrode finger pitch of the IDT electrode is λ, an electrode finger center-to-center distance between an electrode finger located closest to the reflector among the plurality of electrode fingers of the IDT electrode and an electrode finger located closest to the IDT electrode among the plurality of electrode fingers of the reflector is less than about 0.5λ;
  in the at least one of the series-arm resonators, an electrode finger pitch of the reflector is less than an electrode finger pitch of the IDT electrode; and
  an anti-resonant frequency of the at least one of the series-arm resonators is highest among anti-resonant frequencies of the plurality of series-arm resonators.

2. The ladder filter according to claim 1, wherein, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about 0.4λ.

3. A duplexer comprising:
  a transmission filter defined by the ladder filter according to claim 1; and
  a receiving filter having a pass band different from a pass band of the transmission filter.

4. The duplexer according to claim 3, wherein, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about 0.4λ.

5. The duplexer according to claim 3, wherein the anti-resonant frequency of the at least one of the series-arm resonators is the highest among anti-resonant frequencies of the plurality of series-arm resonators.

6. An elastic wave filter device comprising:
  a first band pass filter defined by the ladder filter according to claim 1; and
  at least one second band pass filter having a pass band different from a pass band of the first band pass filter.

7. The elastic wave filter device according to claim 6, wherein, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about 0.4λ.

8. A ladder filter comprising:
  a plurality of series-arm resonators each including an IDT electrode and a reflector; and
  a parallel-arm resonator; wherein
  each of the IDT electrode and the reflector includes a plurality of electrode fingers;
  in at least one of the plurality of series-arm resonators, where a wavelength that is determined by an electrode finger pitch of the IDT electrode is λ, an electrode finger center-to-center distance between an electrode finger located closest to the reflector among the plurality of electrode fingers of the IDT electrode and an electrode finger located closest to the IDT electrode among the plurality of electrode fingers of the reflector is less than about 0.5λ;
  an anti-resonant frequency of the at least one of the series-arm resonators is higher than an anti-resonant frequency of at least another one of the plurality of series-arm resonators; and
  in at least another one of the plurality of series-arm resonators, where a wavelength that is determined by an electrode finger pitch of the IDT electrode is λ, an electrode finger center-to-center distance between an electrode finger located closest to the reflector among the plurality of electrode fingers of the IDT electrode and an electrode finger located closest to the IDT electrode among the plurality of electrode fingers of the reflector is about $0.5\lambda$ or greater.

9. The ladder filter according to claim 8, wherein, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about $0.4\lambda$.

10. The ladder filter according to claim 8, wherein the anti-resonant frequency of the at least one of the series-arm resonators is highest among anti-resonant frequencies of the plurality of series-arm resonators.

11. A duplexer comprising:
a transmission filter defined by the ladder filter according to claim 8; and
a receiving filter having a pass band different from a pass band of the transmission filter.

12. The duplexer according to claim 11, wherein, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about $0.4\lambda$.

13. The duplexer according to claim 11, wherein the anti-resonant frequency of the at least one of the series-arm resonators is the highest among anti-resonant frequencies of the plurality of series-arm resonators.

14. An elastic wave filter device comprising:
a first band pass filter defined by the ladder filter according to claim 8; and
at least one second band pass filter having a pass band different from a pass band of the first band pass filter.

15. The elastic wave filter device according to claim 14, wherein, in the at least one of the series-arm resonators, the electrode finger center-to-center distance between the electrode finger located closest to the reflector among the plurality of electrode fingers of the IDT electrode and the electrode finger located closest to the IDT electrode among the plurality of electrode fingers of the reflector is less than about $0.4\lambda$.

16. The elastic wave filter device according to claim 14, wherein the anti-resonant frequency of the at least one of the series-arm resonators is the highest among anti-resonant frequencies of the plurality of series-arm resonators.

* * * * *